(12) United States Patent
Youn et al.

(10) Patent No.: US 7,557,415 B2
(45) Date of Patent: Jul. 7, 2009

(54) TRENCH ISOLATION TYPE SEMICONDUCTOR DEVICE AND RELATED METHOD OF MANUFACTURE

(75) Inventors: Ki-seog Youn, Suwon-si (KR); Jong-hyon Ahn, Suwon-si (KR); Kwan-jong Roh, Gunpo-si (KR); Hye-kyoung Lee, Seongnam-si (KR)

(73) Assignee: Samsung Electroncis Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 11/650,418

(22) Filed: Jan. 8, 2007

(65) Prior Publication Data
US 2007/0164391 A1 Jul. 19, 2007

(30) Foreign Application Priority Data
Jan. 13, 2006 (KR) .............. 10-2006-0004115

(51) Int. Cl.
*H01L 29/94* (2006.01)
(52) U.S. Cl. .......... 257/374; 257/510; 257/E21.545; 257/E21.551; 257/E21.564; 438/424; 438/248; 438/391
(58) Field of Classification Search .......... 257/510, 257/E21.545, E21.551, E21.564; 438/248, 438/391, 424
See application file for complete search history.

(56) References Cited

U.S. PATENT DOCUMENTS

| | | | | |
|---|---|---|---|---|
| 5,863,827 A | * | 1/1999 | Joyner | ............ 438/425 |
| 5,989,975 A | * | 11/1999 | Kuo | ............ 438/424 |
| 5,989,978 A | | 11/1999 | Peidous | |
| 6,255,194 B1 | | 7/2001 | Hong | |
| 6,261,925 B1 | * | 7/2001 | Arghavani et al. | ........ 438/437 |
| 6,323,102 B1 | * | 11/2001 | Horita et al. | ........ 438/424 |
| 6,500,726 B2 | | 12/2002 | Lee et al. | |
| 6,559,027 B2 | * | 5/2003 | Ishitsuka et al. | ........ 438/424 |
| 6,953,734 B2 | * | 10/2005 | Lim et al. | ........ 438/435 |
| 7,163,869 B2 | * | 1/2007 | Kim et al. | ........ 438/424 |
| 2004/0198019 A1 | * | 10/2004 | Yasui et al. | ........ 438/435 |
| 2006/0160322 A1 | * | 7/2006 | Buehrer et al. | ........ 438/424 |
| 2008/0185676 A1 | * | 8/2008 | Seo | ........ 257/510 |
| 2008/0290446 A1 | * | 11/2008 | Shin et al. | ........ 257/510 |
| 2009/0014810 A1 | * | 1/2009 | Shin et al. | ........ 257/369 |

FOREIGN PATENT DOCUMENTS

| | | |
|---|---|---|
| JP | 2002-237518 | 8/2002 |
| KR | 1020040001290 | 1/2004 |
| KR | 1020040002241 | 1/2004 |

* cited by examiner

*Primary Examiner*—Thanh V Pham
(74) *Attorney, Agent, or Firm*—Volentine & Whitt, PLLC

(57) ABSTRACT

A semiconductor device and related method of manufacture are disclosed. The device comprises; a trench having a corner portion formed in the semiconductor substrate, a first oxide film formed on an inner wall of the trench and having an upper end portion exposing the corner portion of the semiconductor substrate, a nitride liner formed on the first oxide film, a second oxide film formed in contact with the upper end of the first oxide film and on the exposed corner portion and an upper surface of the semiconductor substrate, a field insulating film formed on the nitride liner to substantially fill the trench, and a field protecting film formed in contact with the second oxide film and filling a trench edge recess formed between the field insulating film and the second oxide film.

8 Claims, 8 Drawing Sheets

TRENCH ISOLATION TYPE SEMICONDUCTOR DEVICE AND RELATED METHOD OF MANUFACTURE

BACKGROUND OF THE INVENTION

1. Field of the Invention

The present invention relates to a semiconductor device and a method of manufacturing the same. More particularly, the invention relates to a trench isolation type semiconductor device having reduced junction leakage current in an element isolation region, and a related method of manufacture.

This application claims priority from Korean Patent Application No. 10-2006-0004115 filed on Jan. 13, 2006, the subject matter of which is hereby incorporated by reference in its entirety.

2. Description of the Related Art

A semiconductor device commonly includes a plurality of active and passive elements formed on a semiconductor substrate. Different types of semiconductor devices perform different functions depending on how the various elements are arranged and electrically connected. Accordingly, most of the elements forming a particular semiconductor device must be electrically isolated from one or more adjacent (or proximate) elements in order to properly function. Various structures have been conventionally adopted to provide electrical isolation. One such structure is the so-called Shallow Trench Isolation (STI) structure. The STI structure has excellent element isolation characteristics while only occupying a relatively small surface area of the substrate. These qualities make the STI structure very advantageous in attempts to manufacture semiconductor devices having increased integration.

The STI structure is often formed by first forming a trench region of defined geometry in the substrate and then filling the trench with an insulating material, such as silicon oxide. The insulating material may be formed in the trench using such common fabrication processes as Chemical Vapor Deposition (CVD).

However, the use and formation of the STI structure in not without its problems. The inclusion of STI structures in a semiconductor device may increase the overall manufacturing complexity, and the loss (or lifting) of the insulating material filling the trench may occur, such as during a subsequently applied oxide film cleaning, or wet/dry etching process. When the insulating material in the STI structure is imperfectly formed or damaged/removed during subsequent fabrication processes, junction leakage current may be generated at a boundary surface (e.g., edge portions) between a proximate electrically active region of the substrate and the element isolation region formed by the STI structure. The presence of such leakage current causes deterioration in the performance characteristics of the semiconductor device.

SUMMARY OF THE INVENTION

Embodiments of the invention provide a semiconductor device and manufacturing method capable of minimizing junction leakage current by preventing certain recesses in element isolation regions.

In one embodiment, the invention provides a semiconductor device comprising; a trench having a corner portion formed in the semiconductor substrate, a first oxide film formed on an inner wall of the trench and having an upper end portion exposing the corner portion of the semiconductor substrate, a nitride liner formed on the first oxide film, a second oxide film formed in contact with the upper end of the first oxide film and on the exposed corner portion and an upper surface of the semiconductor substrate, a field insulating film formed on the nitride liner to substantially fill the trench, and a field protecting film formed in contact with the second oxide film and filling a trench edge recess formed between the field insulating film and the second oxide film.

In another embodiment, the invention provides a method of manufacturing a semiconductor device, the method comprising; forming a trench in a semiconductor substrate, sequentially forming a first oxide film and a nitride film on an upper surface of the semiconductor substrate and on an inner wall of the trench, forming a field insulating film to fill the trench, selectively removing portions of the nitride film to form a nitride liner having an exposed upper end portion, expose side surfaces of the first oxide film, expose the first oxide film on the upper surface of the semiconductor substrate, and expose a portion of the first oxide film formed on a corner portion of the semiconductor substrate through a first recess, forming a first field protecting film to cover the exposed upper end portion of the nitride liner and fill the first recess, selectively removing portions of the first oxide film to expose upper surface and the corner portion of the semiconductor substrate, and portions of the exposed side surfaces of the first oxide film to form a second recess, forming a second oxide film thinner than the first oxide film on the exposed corner portion of the semiconductor substrate to partially fill the second recess, and forming a second field protecting film to fill the residual portion of the second recess.

In another embodiment, the invention provides a method of manufacturing a semiconductor device, the method comprising; forming a trench in a semiconductor substrate, sequentially forming a first oxide film and a nitride liner on an inner wall of the trench, forming a field insulating film on the nitride liner to fill the trench, wherein a side surface of the field insulating film, an upper end portion of the nitride liner, an upper end portion of the first oxide film, and an exposed corner portion of the semiconductor substrate form a trench edge recess, forming a second oxide film thinner than the first oxide film on the exposed corner portion of the semiconductor substrate to partially fill the trench edge recess, and forming a field protecting film to fill the residual portion of the trench edge recess.

DESCRIPTION OF EMBODIMENTS

Figure 1:
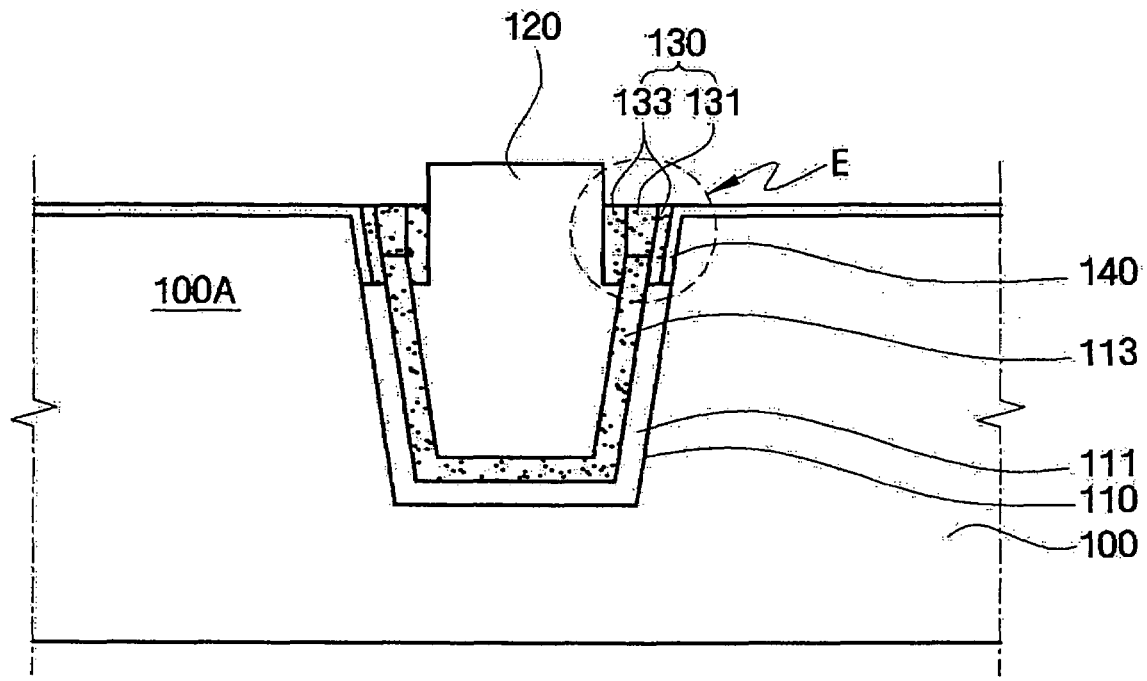
FIG. 1 is a cross-sectional view of an element isolation region in a semiconductor device according to an embodiment of the invention.

Advantages and features of the present invention and methods of accomplishing the same may be understood more readily by reference to the following description of embodiments with reference to the accompanying drawings. The present invention may, however, be embodied in many different forms and should not be construed as being limited to only the embodiments set forth herein. Rather, these embodiments are presented as teaching examples. Throughout the written description and drawings, like reference numerals refer to like or similar elements.

Embodiments of the invention will be described with reference to the cross-sectional views shown in the drawings. These views show idealized embodiments of the invention which in practical implementation may be modified or altered in their form and geometric aspect by manufacturing techniques and/or tolerances. Accordingly, the illustrated embodiments are not limited to the specific configurations shown in the drawings. For example, an etched region shown at a right angle may be formed with a rounded corner. In addition, the relative size and thickness(es) of the various regions shown in the drawings are presented to clearly teach the embodiment. Practical implementations may include different relative thicknesses, proportions, etc.

Hereinafter, a trench isolation type semiconductor device according to an embodiment of the invention will be described with reference to the cross-sectional view of FIG. 1.

Referring to FIG. 1, the illustrated semiconductor device includes a semiconductor substrate 100 having a trench 110 thereon. The trench 110 is used to form an element isolation region defining active region.

The trench 110 may include a first oxide film 111 formed on the inner wall thereof. The first oxide film 111 may be used to cure damage to the inner sidewall and bottom of the trench 110 which may be caused during formation of the trench 110. The first oxide film 111 is conformally formed a certain distance up the inner wall of the trench 110, but leaving a corner edge portion of the semiconductor substrate 100 exposed.

In addition, a nitride liner 113 having an inherent resistance to stress may be formed on the first oxide film 111. In one embodiment, the thickness of the first oxide film 111 is in a range of about 100 to 200 Å and the thickness of the nitride liner 113 is in a range of about 50 to 200 Å. However, actual thicknesses of the first oxide film 111 and the nitride liner 113 will vary with design.

In the illustrated example, an upper end portion of the nitride liner 113 extends beyond an upper end portion of the first oxide film 111. Thus, a first recess region is formed over the upper edge portion of the first oxide 111 between the upper end portion of the nitride liner 113 and the exposed corner portion of the semiconductor substrate 100. Also, in the illustrated example, the upper end portion of the nitride liner 113 is formed below the working surface of the semiconductor substrate 100.

A field insulating film 120 having an excellent gap-filling characteristic is used to fill the trench 110. For example, a high-density plasma silicon oxide (HDP) film or a undoped silicate glass (USG) film may be used as the field insulating film 120. The field insulating film 120 is formed on the nitride liner 113 to fill the trench 110, except for the trench edge recess E between the exposed corner portion of the semiconductor substrate 100 and an outer side wall of the field insulating region 120 encompassing the first recess region. The geometry of the trench edge recess and the field insulating film 120 may be modified in this regard to include a second recess region located between the outer side wall of the field insulating film and an inner side wall of the nitride liner 113 proximate its upper end portion.

A second oxide film 140 may now be formed to partially fill the trench edge recess in the first recess region above the upper end portion of the first oxide film 110. In the illustrated example, the second oxide film 140 is conformally formed with a thickness within the trench edge recess E and on the working surface of the semiconductor substrate 100 that is less than the thickness of the first oxide film 111. Furthermore, as shown in FIG. 1, the second oxide film 140 effectively covers the exposed corner portion of the semiconductor substrate 100.

In one embodiment, the vertical thickness of the second oxide film 140, which is thinner than the first oxide film 111, ranges from about 10 to 50 Å. The actual thickness of second oxide film 140 will be determined in consideration of a minimum thickness required to effectively cover (and thereby repair) any surface damage apparent in the semiconductor substrate 100. In this manner the exposed corner portion of the semiconductor substrate 100 is prepared to receive a subsequently formed material layer.

A field protecting film 130 may now be formed to completely fill the residual portion of the trench edge recess E. In one embodiment, the field protecting film 130 is formed from a first field protecting film 131 and a second field protecting film 133. The first field protecting film 131 extends from the upper end portion of the nitride liner 113, and the second field protecting film 133 otherwise fills residual portions of the trench edge recess E. Since each of the first field protecting film 131 and the second field protecting film 133 may be formed from a material comprising nitride, no substantial material boundaries are necessarily formed between the nitride liner 113 and the first and second field protecting films 131 and 133 as well as between the first field protecting film 131 and the second field protecting film 133.

According to one embodiment of the invention, the lateral breadth of the field protecting film 130 is relatively expanded in order to minimize the thickness of the second oxide film 140. This configuration relative to the trench edge recess portion provides better immunity to the generation of junction leakage current. In particular, as the relatively thin oxide film formed over the exposed corner portion of the substrate reduces the likelihood of junction leakage current generation potentially caused by damage this area by subsequent processes (e.g., a contact formation process). Nonetheless, the second oxide film 140 is able to perform its purpose in repairing damage to the exposed corner portion of the substrate.

A semiconductor device according to another embodiment of the invention will be described with reference to FIG. 2. In the following description of this embodiment, elements substantially the same as those already described in relation to FIG. 1 will not be described for the sake of brevity. Only material differences will be noted between these exemplary embodiments.

Figure 2:
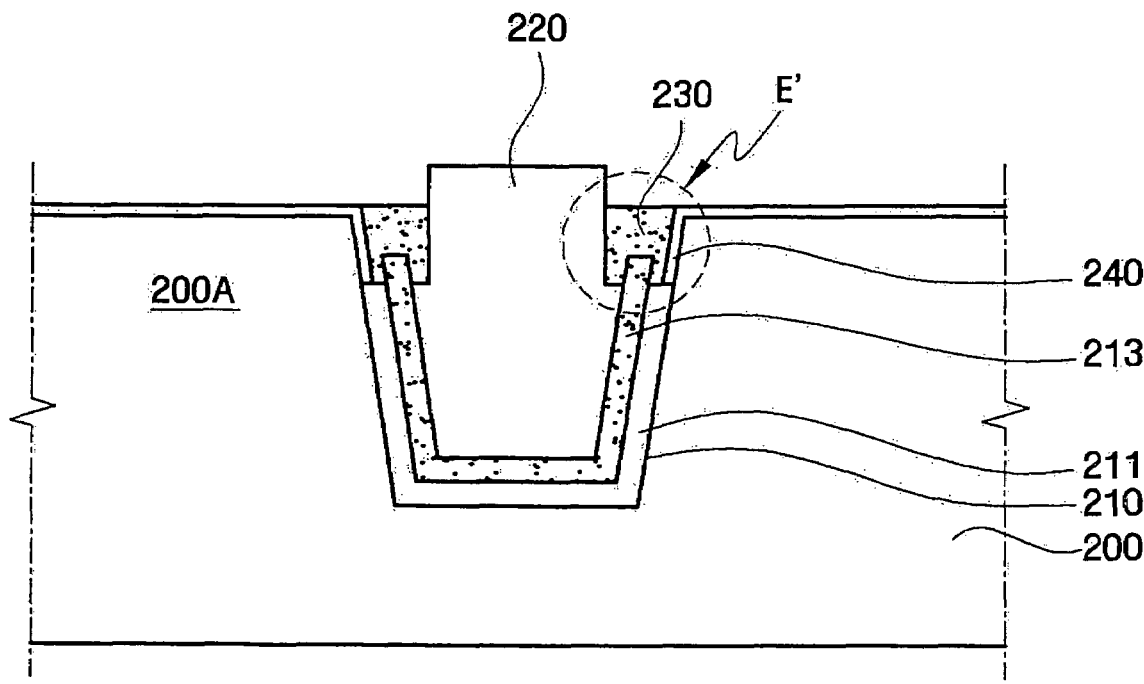
FIG. 2 is a cross-sectional view of an element isolation region in a semiconductor device according to another embodiment of the invention.

As shown in FIG. 2, a semiconductor device according to another embodiment of the invention includes a semiconductor substrate 200 having a trench 210 thereon. As described above, a first oxide film 211 and a nitride liner 213 are sequentially formed on the inner wall of the trench 210, and a field insulating film 220 is formed to substantially fill the trench 210.

A second oxide film 240 is formed extending over at least part of the upper end portion of the first oxide film 211, the exposed corner portion of the semiconductor substrate 100 as well as its working surface. As before, the second oxide film 240 may be thinner than the first oxide film 211. The nitride liner 213 may extend upward beyond the upper end portion of the first oxide film 211. Therefore, a first recess region is to be formed between the nitride liner 213 and the second oxide film 240. In addition, a second recess region extending over the nitride liner 213 is formed between the field insulating film 220 and the first recess region.

Here, a field protecting film 230 is formed to fill the trench edge recess E', including the first and second recess regions.

Since the field protecting film 230 may be formed from a material comprising nitride, no substantial boundaries are necessarily formed between the nitride liner 213 and the field protecting film 230.

As described above, in the semiconductor device according to the foregoing embodiments of the invention, it is possible to greatly reduce the likelihood of leakage current generation while at the time minimizing the thickness of the oxide film at the trench edge portion adjacent to the active region. As a result, since the junction leakage current can be minimized at the edge of the element isolation region, it is possible to improve the performance characteristics of the semiconductor device.

Hereinafter, a method of manufacturing the semiconductor device according to the embodiments of the invention will be described. Processes related to processes known to those skilled in the art of the invention will be schematically described in the following description of the method to avoid ambiguous definition of the invention.

First, an exemplary method of manufacturing the semiconductor device shown in FIG. 1 will be described with reference to FIGS. 3A to 3J.

Figure 3A:
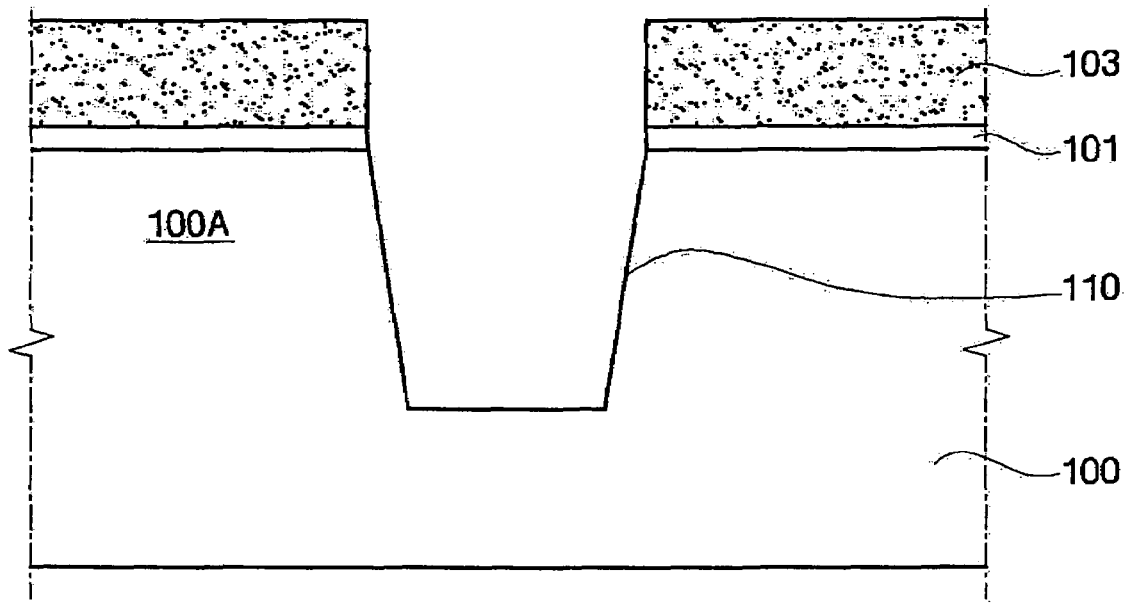
FIGS. 3A to 3J are cross-sectional views of intermediate products in intermediate processes of a method of manufacturing the semiconductor device shown in FIG. 1.

As shown in FIG. 3A, the trench 110 is formed on the semiconductor substrate 100. The trench 110 is a region used to form the element isolation region defining the active region 100A. In this case, an etching mask, which includes a buffer insulating film pattern 101 and a hard mask 103, may be formed on the semiconductor substrate 100 before an etching process of forming the trench.

The buffer insulating film pattern 101 is provided to help reduce or prevent stress defects caused by the different thermal expansion coefficients between the semiconductor substrate 100 and hard mask 103. In one embodiment, the buffer insulating film pattern 101 may be formed from a silicon oxide film having a thickness in a range of between about 100 to 300 Å using an oxidation method or some equivalent deposition method.

Further, the hard mask 103 is used when the semiconductor substrate 100 is etched to form the trench 110, and may comprise a material film that has an etching selectivity between the semiconductor substrate 100 and itself. The hard mask 103 may be used as a planarization stop film for a subsequently applied Chemical Mechanical Polishing (CMP) process. In one embodiment, it is preferable that the hard mask 103 be formed with a thickness sufficient to prevent damages caused by the planarization process. For example, silicon nitride may be deposited on the semiconductor substrate 100 to a thickness ranging from about 100 to 2000 Å. However, if an antireflection film is formed on the semiconductor substrate, the hard mask can be deposited on the semiconductor substrate with a reduced thickness.

In the illustrated example, the trench 110 has an aspect ratio designed to avoid the formation of voids when a field insulating film 120 is used to fill the trench 110. The aspect ratio may be determined in relation to the fill characteristics of the field insulating film 120. For example, if the field insulating film 120 has excellent fill characteristics, the trench 110 may have a relatively large aspect ratio. However, if the field insulating film 120 has relatively poor fill characteristics, the trench 110 should have a smaller aspect ratio.

Figure 3B:
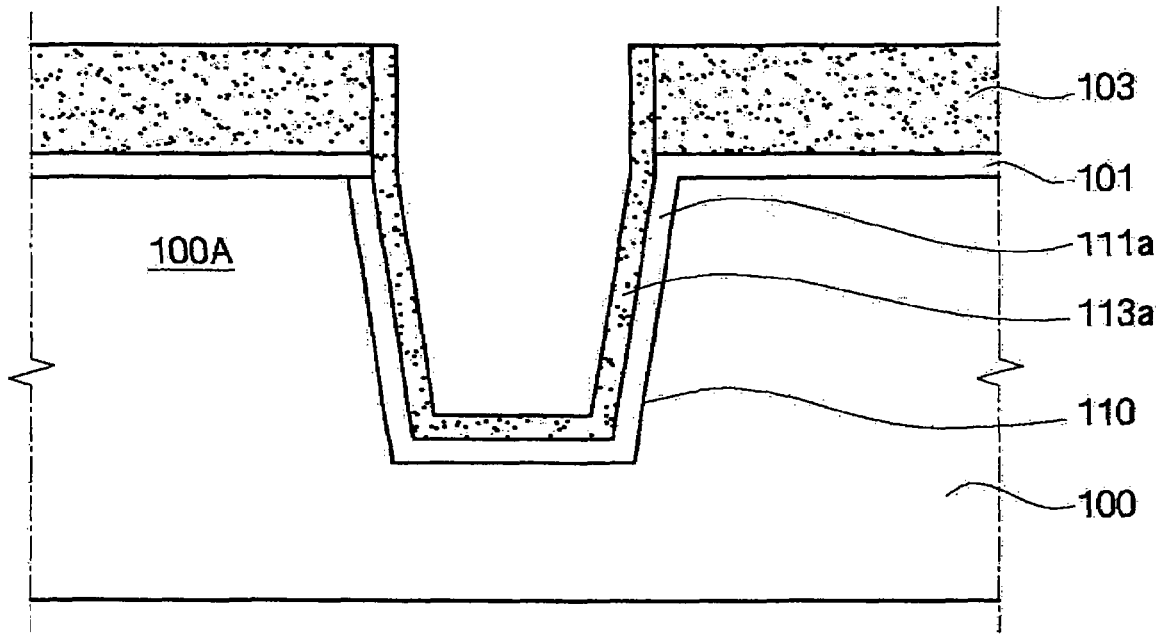

As shown in FIG. 3B, a first oxide film 111a and a nitride liner 113a are sequentially formed on the inner wall of the trench 110.

The first oxide film 111a may be conformally formed on the inner wall of the trench 110 using a thermal oxidation process, for example. Several conventional furnace type apparatuses or equivalent processing chambers may be used to perform the thermal oxidation process. In one embodiment, a thermal oxidation process provides O2 or H2O as an oxygen source to the apparatus at a temperature of about 800 to 1100° C. HCl may be added in the atmosphere in the apparatus to increase the oxidation rate. However, since HCl causes corrosion, HCl may be not used in a wet oxidation process using H2O. Under the assumptions of this example, the first oxide film 111a may be formed to a thickness in the range of about 100 to 200 Å.

In addition, the nitride liner 113a may be conformally formed on the first oxide film 111a using such conventionally understood methods as CVD, SACVD, LPCVD and/or PECVD, etc. The nitride liner 113a is resistant to tensile stress and in one embodiment is formed to a thickness in the range of about 50 to 200 Å.

Figure 3C:
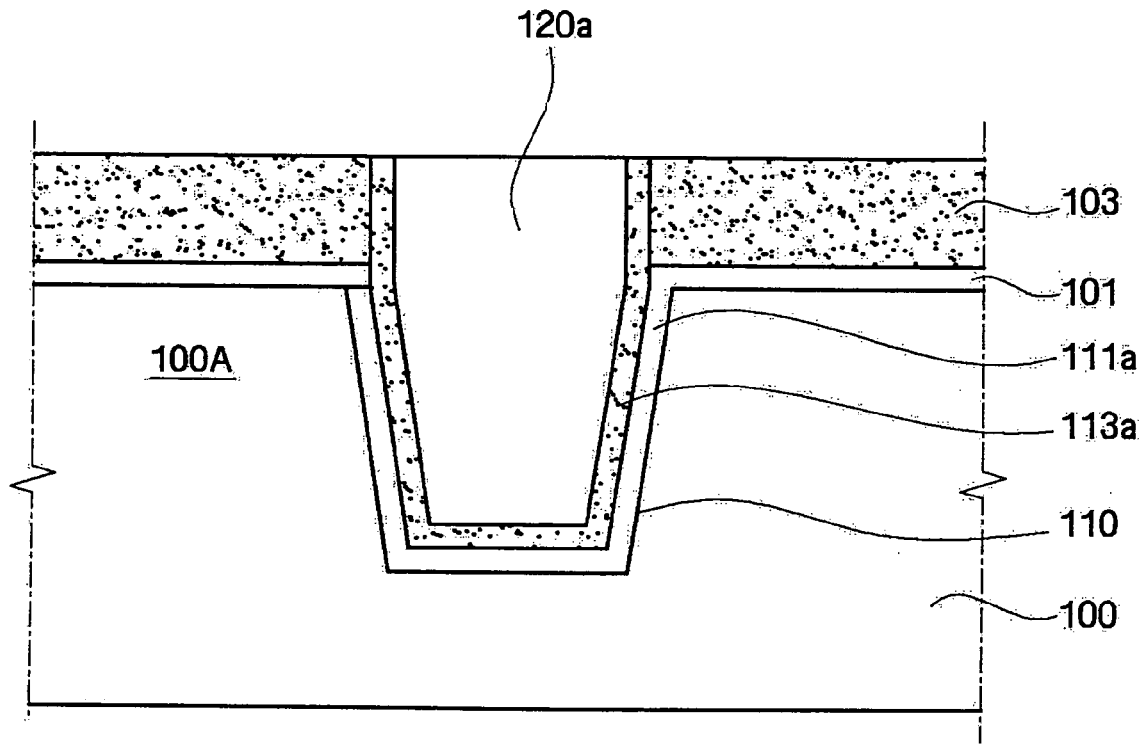

Subsequently, as shown in FIG. 3C, a field insulating film 120a is formed to fill the trench 110. The material (or combination of materials) used to form the field insulating film is applied over the entire surface of the semiconductor substrate 100 to completely fill the trench 110. A silicon oxide film having an excellent gap-filling characteristic, for example, a HDP silicon oxide film or a USG film may be used as the field insulating film. Subsequently, the material layer used to form the field insulating film may be planarized using a CMP process. Accordingly, it is possible to form a field insulating film 120a that completely fills the trench 110 to a level flush with the upper surface of the hard mask 103. After its formation, the field insulating film 120a may be densified in an N2, O2, or H2O atmosphere heated to a temperature of between about 800 to 1100° C., in order to minimize the loss of the field insulating film during subsequently applied fabrication processes, such as etching processes, etc. Densification works by extracting moisture from the field insulating film 120a to harden it. The process of densifying the field insulating film 120a may be selectively and optionally performed.

Figure 3D:
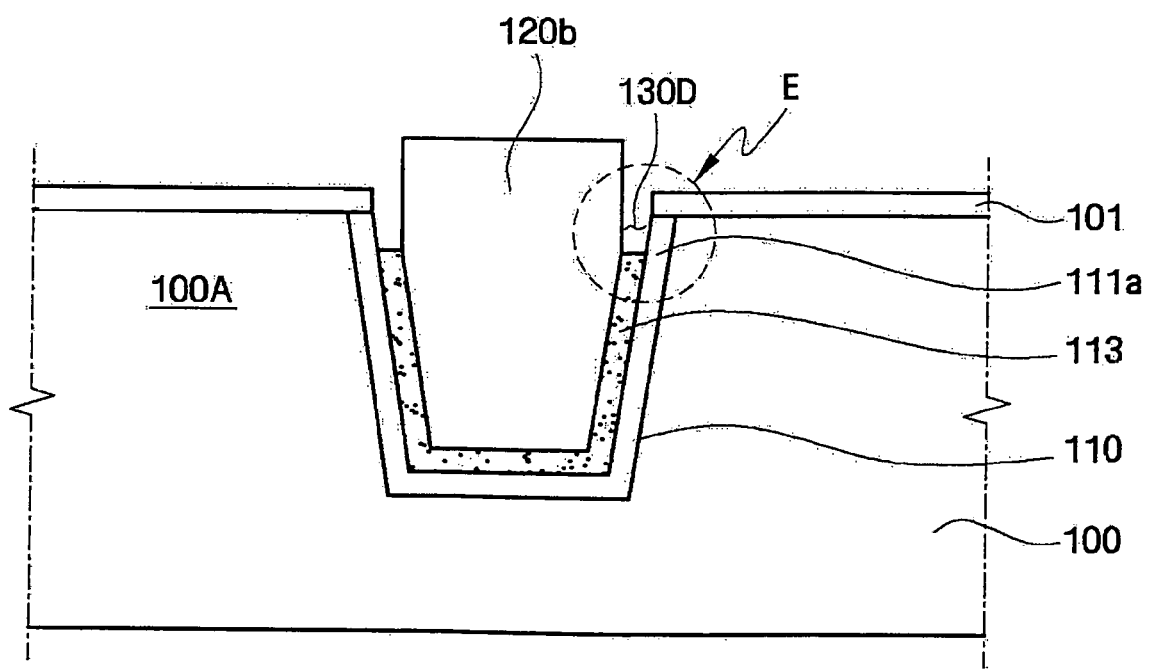

As shown in FIG. 3D, the hard mask 103 and the nitride liner 113 are partially removed to expose the first oxide film 111a formed on the corner portion of the semiconductor substrate 100.

Here, an upper portion of the nitride liner 113a (as shown between FIGS. 3C and 3D) may be removed together with the hard mask 103. For example, when the hard mask 103 and the nitride liner 113a are formed from a similar material comprising nitride, and assuming that the hard mask 103 is removed using a wet etching process including an etchant containing phosphoric acid, or a dry etching process using plasma, it is possible to etch away an upper portion of the nitride liner 113. As a result, a recess 130D may be formed between the first oxide film 111 and the field insulating film 120b (i.e., a portion of the trench edge recess E is formed). This recess 130D exposes a side surface of the first oxide film 111a formed proximate the corner portion of the semiconductor substrate 100.

Figure 3E:
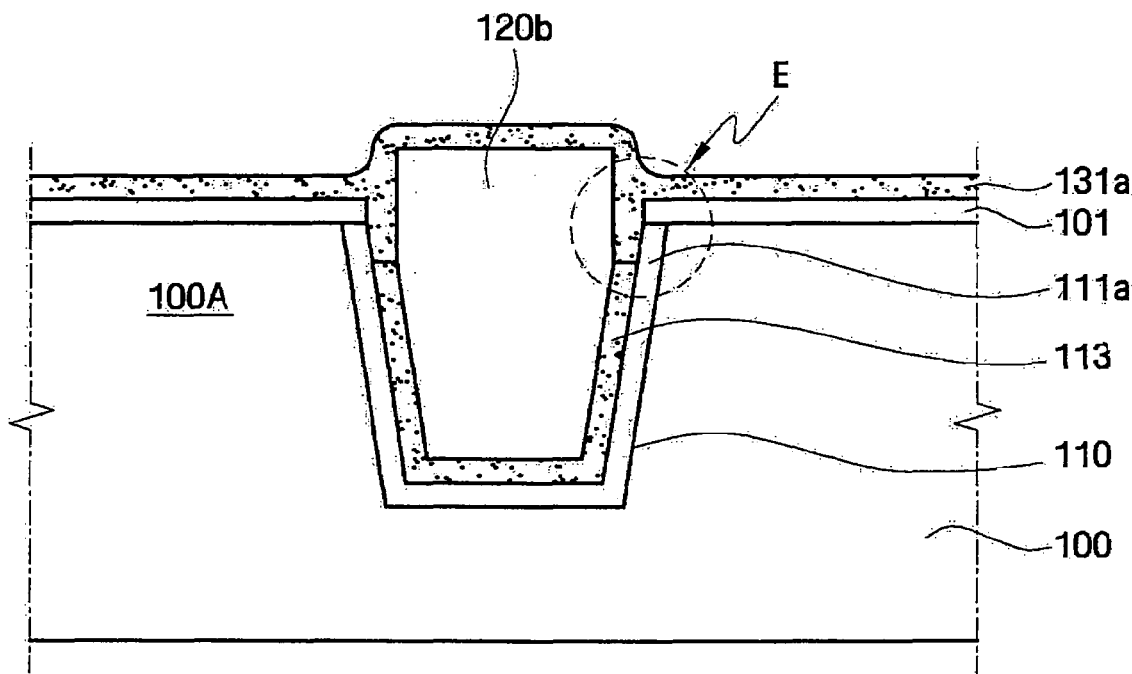
Figure 3F:
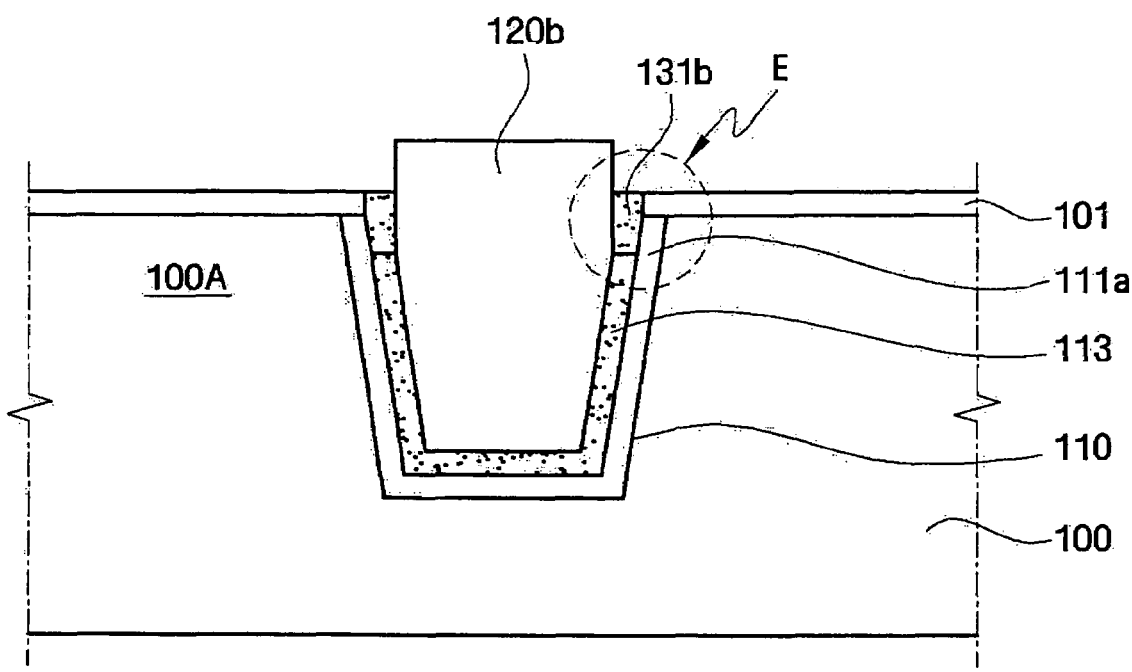

Subsequently, as shown in FIGS. 3E and 3F, a first field protecting film covering the exposed sidewall surface of the first oxide film 111a.

As shown in FIG. 3E, an insulating film 131a is formed to fill the recess 130D shown in FIG. 3D and serve as a first field protecting film. This insulating film 131a is removed down to the upper surface of the buffer insulating film pattern 101. As a result, it is possible to obtain the structure shown in FIG. 3F. The insulating film 131a may be formed form silicon nitride, for example.

Referring to FIG. 3F, the upper portion of the insulating film 131a having been removed, a first field protecting film 131b is formed. The upper surface of the buffer insulating film pattern 101 is exposed, but the first recess formed in the trench edge recess E is filled by the first field protecting film 131b. The process used to remove the upper surface of the insulating film 131a may be the same as that used to remove the nitride liner 113a and/or the hard mask 103.

Figure 3G:
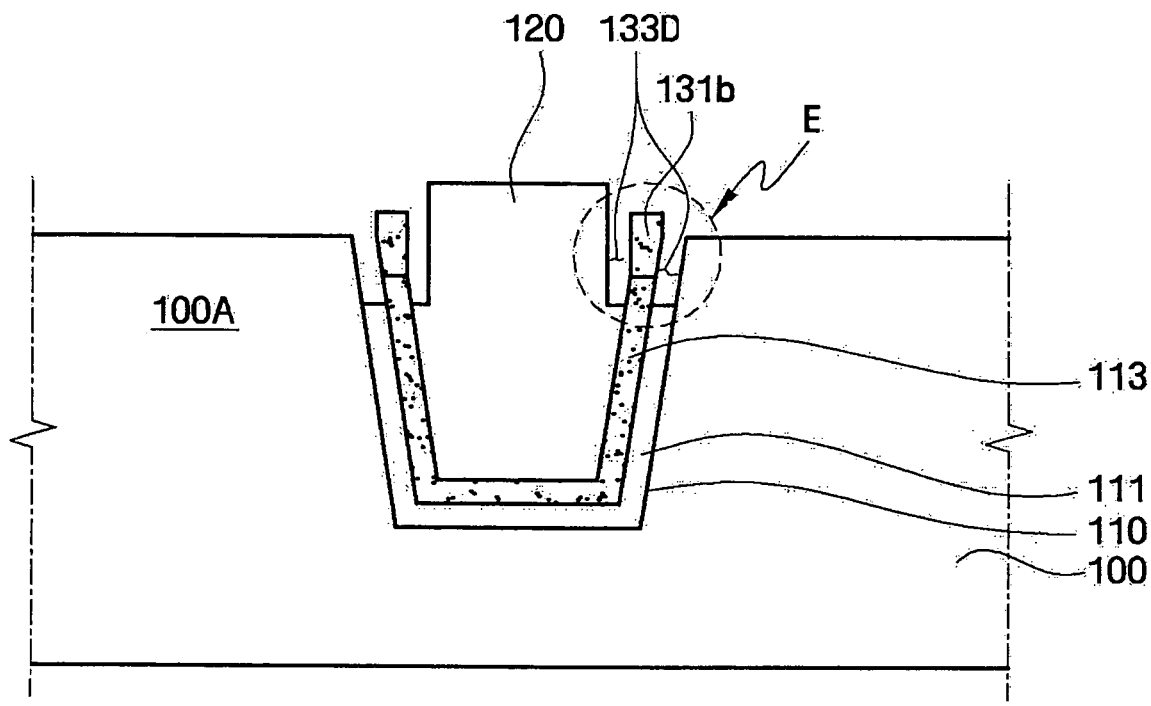

As shown in FIG. 3G, the buffer insulating film pattern 101 and an upper portion of the first oxide film 111a are removed to expose the corner portion of the semiconductor substrate 100 proximate the trench edge recess E and upper and side surfaces of the first field protecting film 131b. For example, when the buffer insulating film pattern 101 and the first oxide film 111 are formed from a similar material, such as silicon oxide, the buffer insulating film pattern 101 and an upper portion of the first oxide film 111 may be effectively removed with a wet etching process using an etchant containing an HF liquid. As a result, it is possible to form predetermined a second recess 133D surrounding first field protecting film 131b. In this case, if the field insulating film 120 is comprised silicon oxide, the second recess 133D may be also formed by a partial removal of the field insulating film 120 proximate the first field protecting film 131b and nitride liner 113 as shown in FIG. 3G. The second recess 133D may be formed to expose the side surface of the first field protecting film 131b and side surface of the upper end portion of the nitride liner 113.

Figure 3H:
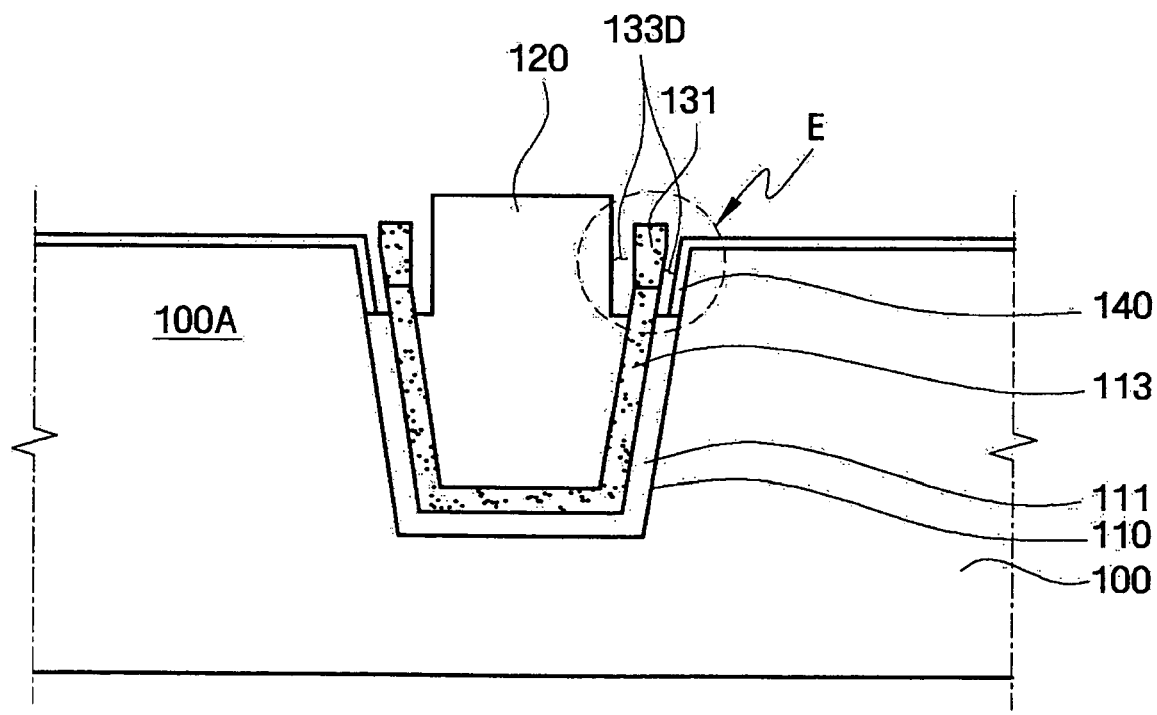

As shown in FIG. 3H, a thin second oxide film 140 may now be conformally formed on the exposed corner portion of the semiconductor substrate 100 to partially fill the trench edge recess E. In one embodiment, the second oxide film 140 is connectivity formed with an upper end portion of the first oxide film 111 exposed by second recess 133D.

The second oxide film 140 may be more thinly formed than the first oxide film 111. For example, the thickness of the second oxide film 140 may be in the range of about 10 to 50 Å, but sufficient to cure any damage to the semiconductor substrate 100 and facilitate the formation of a second field protecting film 133. (See, FIG. 3J). However, as the thickness of the second oxide film 140 becomes larger, the second oxide film 140 may cause the element isolation region to be dually recessed during subsequently applied processes. For this reason, junction leakage current may be caused. Accordingly, the thickness of the second oxide film 140 should be determined to be of minimal thickness while facilitating the formation of the second field protecting film 133 and curing defects on the substrate. In one embodiment, the second oxide film 140 is formed using a thermal oxidation process and extends over the upper surface of the active region 100A.

Figure 3I:
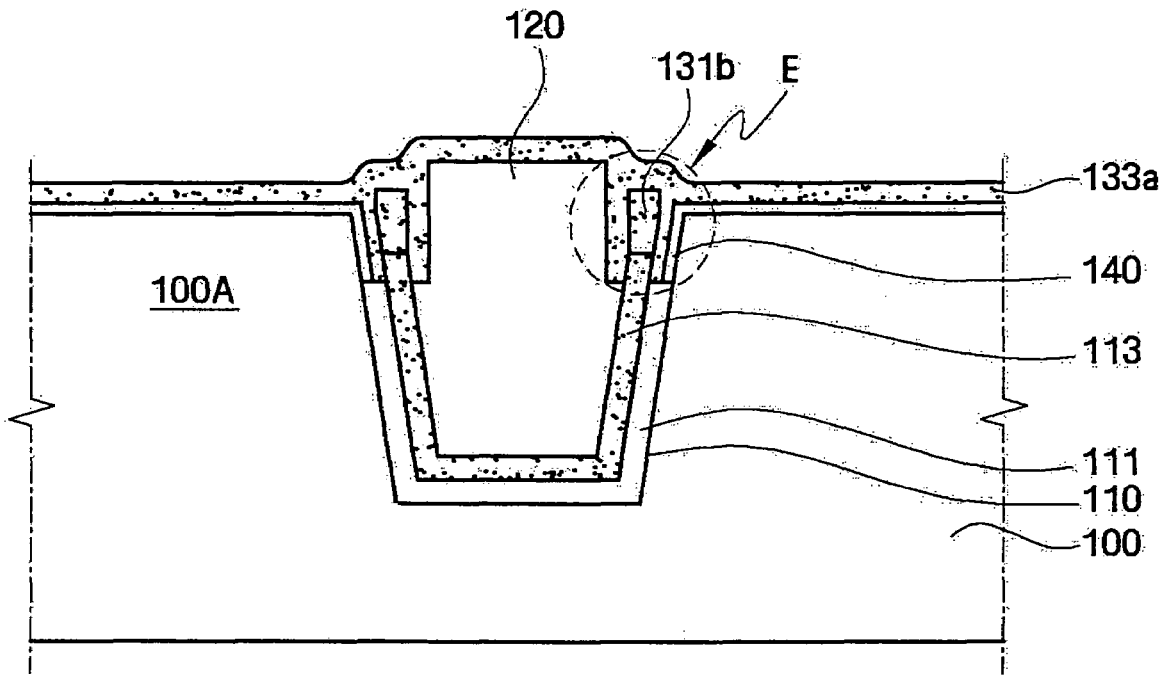
Figure 3J:
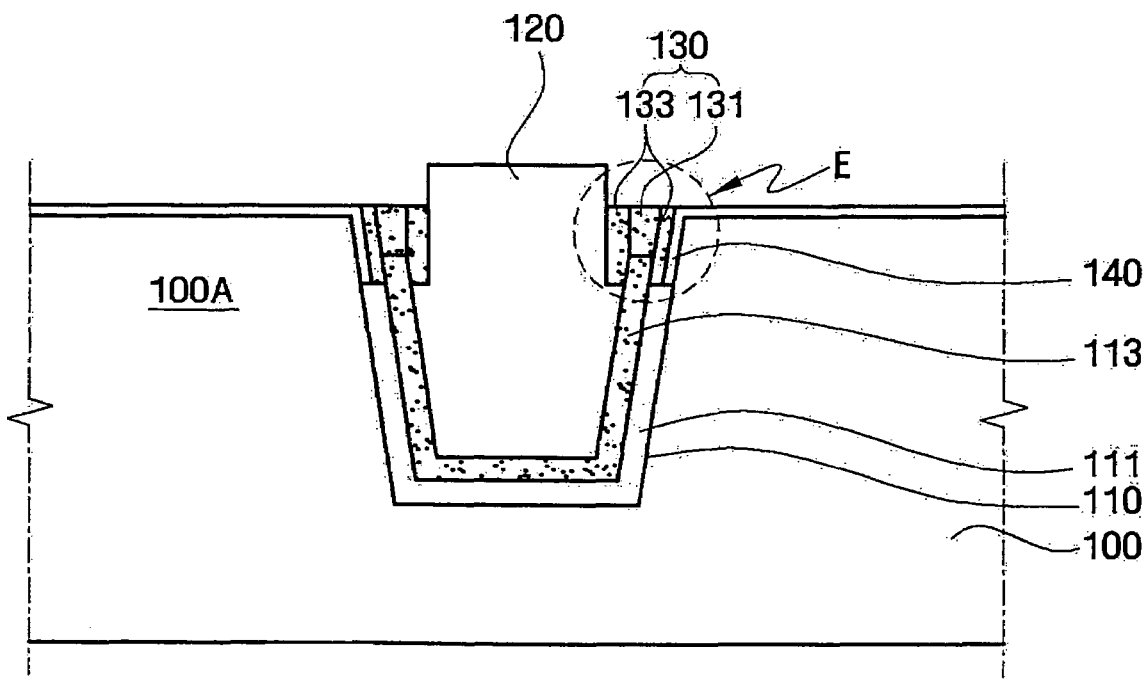

Subsequently, a second field protecting film 133 is formed to fill the residual portions of trench edge recess E, as shown in FIGS. 3I and 3J.

As shown in FIG. 3I, after an insulating film 133a is formed to completely fill the second recess 130D of FIG. 3H within the trench edge recess E. When this film is later etched down to the upper surface of second oxide film 140, the second field protecting film 133 is formed. As a result, it is possible to form a second field protecting film 133 filling second recess 133D as shown in FIG. 3J.

The second field protecting film 133 may be formed from the same material as the first field protecting film 131, and may in one embodiment be silicon nitride. As a result, it is possible to complete the field protecting film 130. The field protecting film 130 allows the oxide film to have a minimal thickness proximate the trench edge recess E adjacent to the active region 100A. Accordingly, it is possible to greatly reduce the likelihood of junction leakage current.

Hereinafter, an exemplary method of manufacturing the semiconductor device shown in FIG. 2 will be described with reference to FIGS. 4A and 4D. Only material difference between the processes described in relation to FIGS. 3A through 3C and FIGS. 4A through 4D will be noted.

Figure 4A:
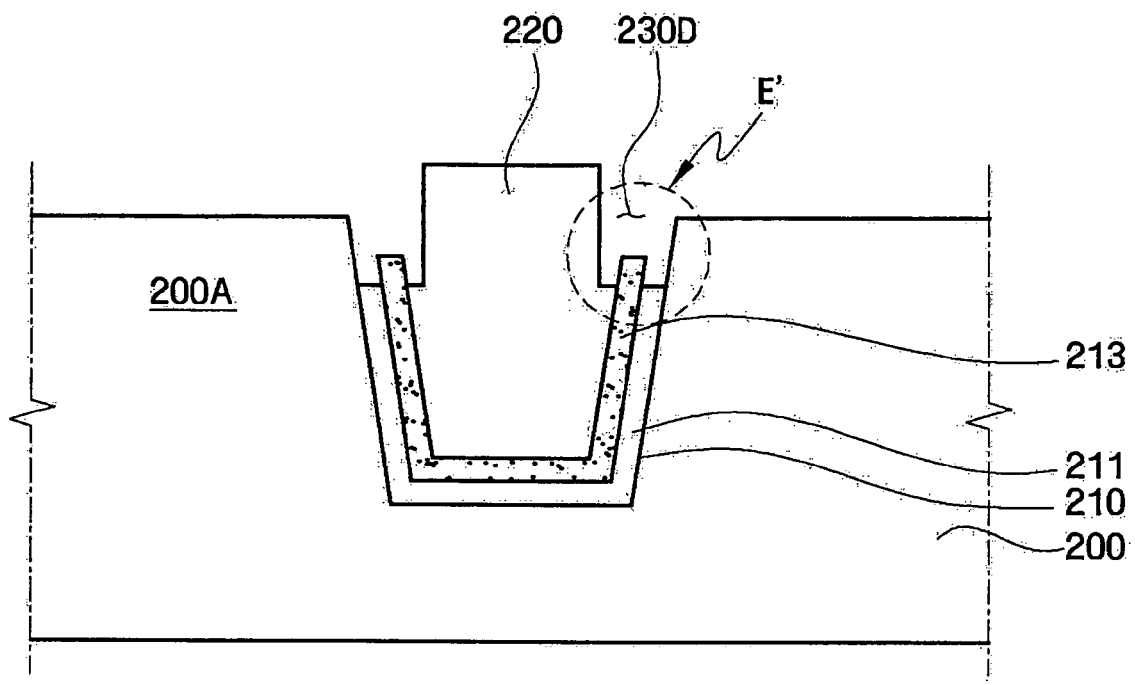
FIGS. 4A to 4D are cross-sectional views of intermediate products in intermediate processes of a method of manufacturing the semiconductor device shown in FIG. 2.

Referring to FIG. 4A, a first oxide film 211 and a nitride liner 213 are partially removed to expose a trench edge recess E'.

This may be done in conjunction with the removal of a hard mask and/or a buffer insulating film pattern. As a result, a recess 230D is formed in the trench edge recess region E' and the upper surface of an active region 200A is also exposed. An upper end portion of the first oxide film 211 and an upper end portion of the nitride liner 213 are also exposed in recess 230D. These upper end portions may equally or unequally lower than the upper surface of the semiconductor substrate 200.

Figure 4B:
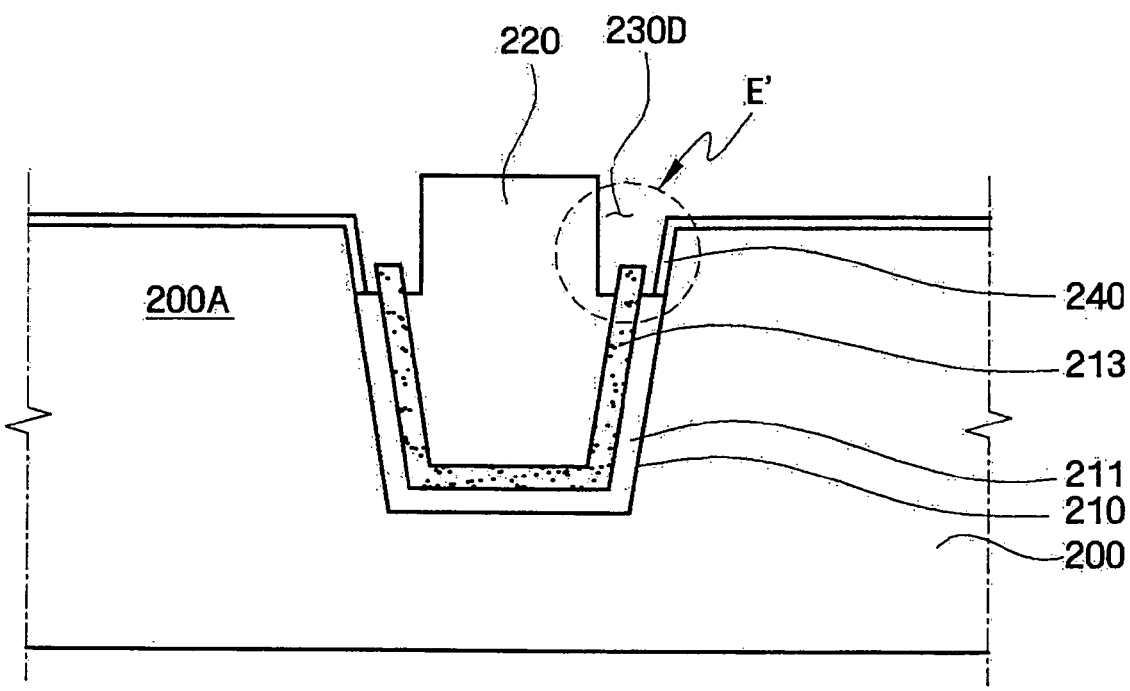

A second oxide film 240 is conformally formed on the surface of the semiconductor substrate 200 over the exposed corner portion of semiconductor substrate, as shown FIG. 4B. In this illustrated example, the second oxide film 240 may extend from the first oxide film 211, and may be formed with a thickness thinner than the first oxide film 211.

Figure 4C:
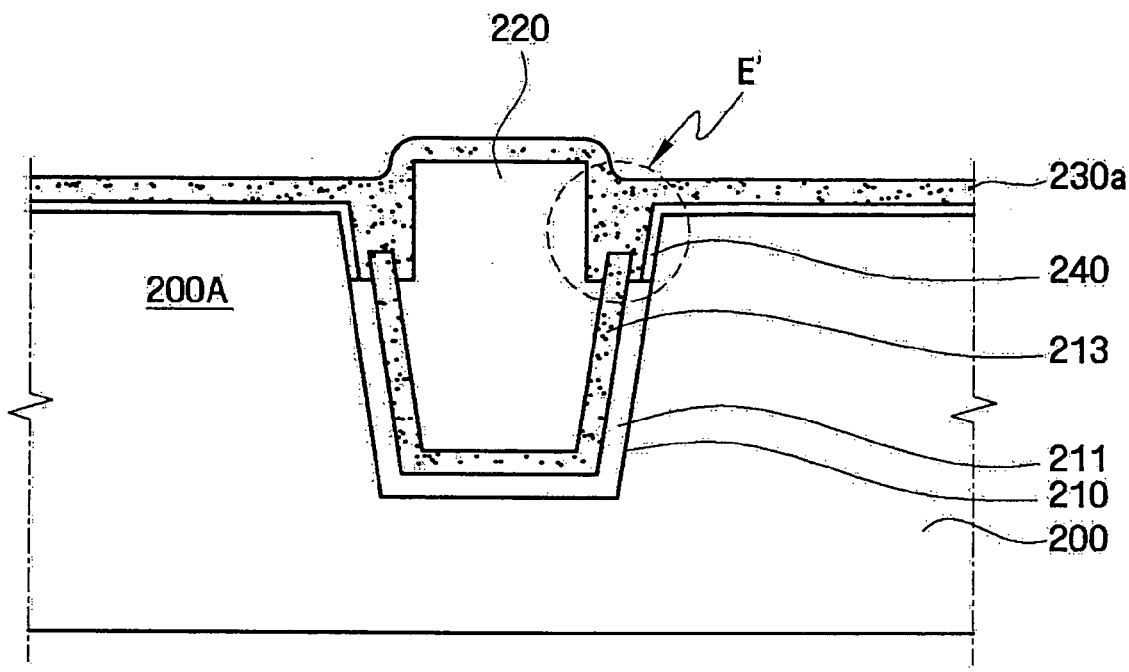
Figure 4D:
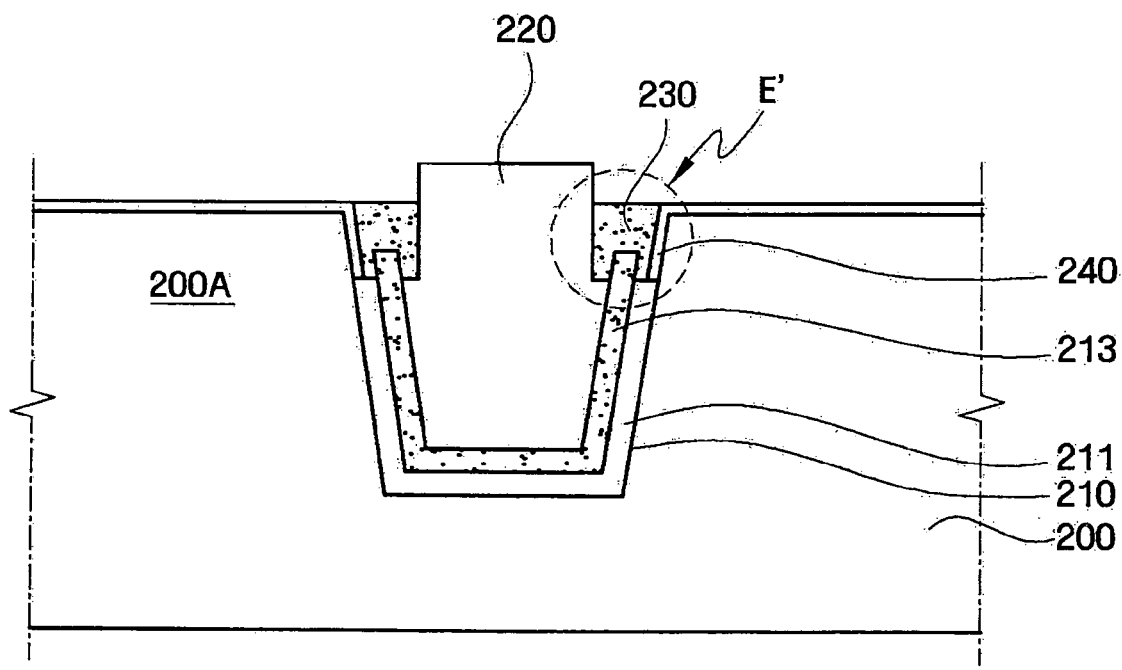

A field protecting film 230 may now be formed to fill the trench edge recess E', as shown in FIGS. 4C and 4D.

As shown in FIG. 4C, after an insulating film 230a is formed to fill the trench edge recess E', it may be etched to form a field protecting film 230, as shown in FIG. 4D.

Although the invention has been described in connection with the exemplary embodiments, it will be apparent to those skilled in the art that various modifications and changes may be made thereto without departing from the scope of the invention. Therefore, it should be understood that the above embodiments are not limitative, but illustrative in their nature.

What is claimed is:

1. A semiconductor device comprising:
 a trench having an upper corner portion formed in a semiconductor substrate;
 a first oxide film formed on an inner wall of the trench and having an upper end portion exposing a corner portion of the semiconductor substrate;
 a nitride liner formed on the first oxide film;
 a second oxide film formed in contact with the upper end of the first oxide film and on the upper corner portion and an upper surface of the semiconductor substrate;
 a field insulating film formed on the nitride liner to substantially fill the trench; and
 a field protecting film formed in contact with the second oxide film and filling a trench edge recess formed between the field insulating film and the second oxide film, the field protecting film surrounding the top of the nitride liner.

2. The semiconductor device of claim 1, wherein the upper end portion of the first oxide film is formed lower than the upper surface of the semiconductor substrate.

3. The semiconductor device of claim 2, wherein the nitride liner comprises an upper end portion formed higher than the upper end portion of the first oxide film and lower than the upper surface of the semiconductor substrate.

4. The semiconductor device of claim 3, wherein the field protecting film is formed on the upper end portion of the nitride liner.

5. The semiconductor device of claim 3, wherein the trench edge recess comprises a first recess between the nitride liner and the second oxide film and a second recess between the nitride liner and the field insulating film.

6. The semiconductor device of claim 5, wherein,
the field protecting film is formed from a material comprising nitride, such that no substantial material boundary is formed between the field protecting film and the nitride liner.

7. The semiconductor device of claim 1, wherein the second oxide film is thinner than the first oxide film.

8. The semiconductor device of claim 1, wherein the field protecting film is formed with an upper surface co-planar with the upper surface of the semiconductor substrate.

* * * * *